(12) United States Patent
Lee et al.

(10) Patent No.: US 12,333,116 B2
(45) Date of Patent: Jun. 17, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Dongmin Lee, Yongin-si (KR); Joonyong Park, Yongin-si (KR); Joonwoo Bae, Yongin-si (KR); Hyuneok Shin, Yongin-si (KR); Samtae Jeong, Yongin-si (KR); Yungbin Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/506,026

(22) Filed: Nov. 9, 2023

(65) Prior Publication Data

US 2024/0319831 A1   Sep. 26, 2024

(30) Foreign Application Priority Data

Mar. 24, 2023 (KR) ..................... 10-2023-0039125
May 16, 2023 (KR) ..................... 10-2023-0063254

(51) Int. Cl.
   *G06F 3/044* (2006.01)
   *G06F 3/041* (2006.01)
   *H10K 59/40* (2023.01)

(52) U.S. Cl.
   CPC .......... *G06F 3/0445* (2019.05); *G06F 3/0412* (2013.01); *H10K 59/40* (2023.02); *G06F 2203/04103* (2013.01); *G06F 2203/04111* (2013.01)

(58) Field of Classification Search
   CPC ...... G06F 3/0445; G06F 3/0412; H10K 59/40
   USPC .................................. 345/173–174
   See application file for complete search history.

(56) References Cited

U.S. PATENT DOCUMENTS

| | | | |
|---|---|---|---|
| 9,489,101 B2 | 11/2016 | Lee et al. | |
| 10,452,176 B2 | 10/2019 | Zhou | |
| 11,422,654 B2 | 8/2022 | Choi et al. | |
| 2015/0205033 A1* | 7/2015 | Hong | G06F 3/042 345/87 |
| 2016/0306475 A1* | 10/2016 | Cho | G06F 3/0446 |
| 2018/0024698 A1* | 1/2018 | Cheng | G06F 3/0428 345/175 |
| 2018/0084680 A1* | 3/2018 | Jarvis | H05K 9/0033 |
| 2018/0261785 A1* | 9/2018 | Ahmed | H10K 59/35 |
| 2018/0264357 A1* | 9/2018 | Dalton | A63F 13/22 |

(Continued)

FOREIGN PATENT DOCUMENTS

| | | |
|---|---|---|
| CN | 106201071 | 12/2016 |
| CN | 111722757 | 9/2020 |

(Continued)

*Primary Examiner* — Kwin Xie
(74) *Attorney, Agent, or Firm* — F. CHAU & ASSOCIATES, LLC

(57) ABSTRACT

A display apparatus includes a first insulating layer, a conductive pattern disposed directly on the first insulating layer, a cladding pattern disposed on side surfaces of the conductive pattern, and a second insulating layer on the conductive pattern and the cladding pattern, wherein the cladding pattern includes a first cladding layer including a first material and a second cladding layer including a second material different from the first material.

20 Claims, 15 Drawing Sheets

(56) References Cited

U.S. PATENT DOCUMENTS

2021/0175282 A1\* 6/2021 Ikeda .................. G06F 3/04166
2022/0238849 A1 7/2022 Oh et al.
2023/0165119 A1 5/2023 Wang
2023/0205376 A1 6/2023 Kwon et al.

FOREIGN PATENT DOCUMENTS

| JP | 2007-311391 | 11/2007 |
|---|---|---|
| KR | 10-2053238 | 1/2020 |
| KR | 10-2022-0021055 | 2/2022 |
| KR | 10-2438934 | 9/2022 |

\* cited by examiner

DISPLAY APPARATUS AND METHOD OF MANUFACTURING THE SAME

CROSS-REFERENCE TO RELATED APPLICATIONS

This application is based on and claims priority under 35 U.S.C. § 119 to Korean Patent Application Nos. 10-2023-0039125, filed on Mar. 24, 2023, and 10-2023-0063254, filed on May 16, 2023, in the Korean Intellectual Property Office, the disclosures of which are incorporated by reference herein in their entirety.

BACKGROUND

1. Technical Field

One or more embodiments relate to a display apparatus and a method of manufacturing the same.

2. Description of Related Art

Various types of display apparatuses have been developed and used. Some types of display apparatuses may include an input sensing unit that may detect externally-applied input. The input sensing unit may improve user interactions with a device including such a display apparatus. A representative form of the externally-applied input is touch. For example, the display apparatus may include conductive patterns that may respond to touch to output electrical signals that may be used to interact with an application running on the device.

SUMMARY

An input sensing layer may include a metal pattern with improved input sensitivity. As a thickness of a wiring that constitutes the metal pattern increases, external light may be reflected on side surfaces of the wiring so that the metal pattern may be visible to a user. One or more embodiments include a display apparatus in which a metal pattern may be prevented from being visible to a user due to external light reflection. The above-described objective is illustrative, and objectives to be solved in the present disclosure are not limited to the above-described objective.

Additional aspects will be set forth in the description which follows and will be apparent from the description, or may be learned by practice of the presented embodiments of the disclosure.

According to an aspect of the disclosure, a display apparatus includes a first insulating layer, a conductive pattern disposed directly on the first insulating layer, a cladding pattern disposed on side surfaces of the conductive pattern, and a second insulating layer on the conductive pattern and the cladding pattern, wherein the cladding pattern includes a first cladding layer including a first material and a second cladding layer including a second material different from the first material.

The first material of the first cladding layer of the cladding pattern may include a metal.

The second material of the second cladding layer of the cladding pattern may include silicon and is formed on the first cladding layer.

The conductive pattern may include a first conductive pattern layer disposed on the first insulating layer, a second conductive pattern layer disposed on the first conductive pattern layer and having a thickness greater than a thickness of the first pattern layer, and a third conductive pattern layer disposed on the second conductive pattern layer and having a thickness less than the thickness of the second conductive pattern layer.

The second conductive pattern layer may include a material having an etch selectivity different from an etch selectivity of each of the first conductive pattern layer and the third conductive pattern layer.

The side surfaces of the second conductive pattern layer may include an inclined surface with respect to a top surface of the first insulating layer, and the first cladding layer may cover at least a portion of the inclined surface of the second conductive pattern layer.

The inclined surface of the second conductive pattern layer may have an angle of about 60 degrees to about 90 degrees with respect to the top surface of the first insulating layer.

A thickness of at least a portion of the first cladding layer may increase in a direction.

The second cladding layer may be in direct contact with the first cladding layer, and a thickness of the second cladding layer may decrease in a direction.

A width of the third conductive pattern layer may be greater than a width of the second conductive pattern layer.

The metal of the first cladding layer may include titanium (Ti).

The second cladding layer may include at least one of silicon oxide ($SiO_x$), silicon nitride (SiNx), silicon oxynitride (SiON) or amorphous silicon (a-Si).

According to another aspect of the disclosure, a method of manufacturing a display apparatus, includes forming a first insulating layer, forming a conductive pattern directly on the first insulating layer, forming a cladding pattern on side surfaces of the conductive pattern, and forming a second insulating layer on the conductive pattern and the cladding pattern, wherein the cladding pattern includes a first cladding layer including a first material and a second cladding layer including a second material different from the first material.

The forming of the conductive pattern may include forming a first conductive pattern layer on the first insulating layer, forming a second conductive pattern layer on the first conductive pattern layer and having a thickness greater than a thickness of the first pattern layer, and forming a third conductive pattern layer on the second conductive pattern layer and having a thickness less than a thickness of the second conductive pattern layer.

Forming the second conductive pattern layer may include forming the second conductive pattern layer having side surfaces having an inclined surface with respect to the top surface of the first insulating layer, and the first cladding layer may cover at least a portion of the inclined surface of the second conductive pattern layer.

A width of the third conductive pattern layer may be greater than a width of the second conductive pattern layer.

The forming of the cladding pattern may include forming a first cladding material layer on the conductive pattern, forming a second cladding material layer on the first cladding material layer, and etching the first cladding material layer and the second cladding material layer to form the first cladding layer and the second cladding layer, respectively.

The etching of the first cladding material layer and the second cladding material layer may include dry etching.

The first cladding layer of the cladding pattern may include a metal and the second cladding layer may include silicon.

According to another aspect of the disclosure, a display apparatus includes a first insulating layer, a conductive pattern including a bottom surface in direct contact with the first insulating layer, a top surface opposite to the bottom surface, and side surfaces between the bottom surface and the top surface, a cladding pattern disposed on the side surfaces of the conductive pattern, and a second insulating layer on the conductive pattern and the cladding pattern, wherein the cladding pattern includes silicon.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
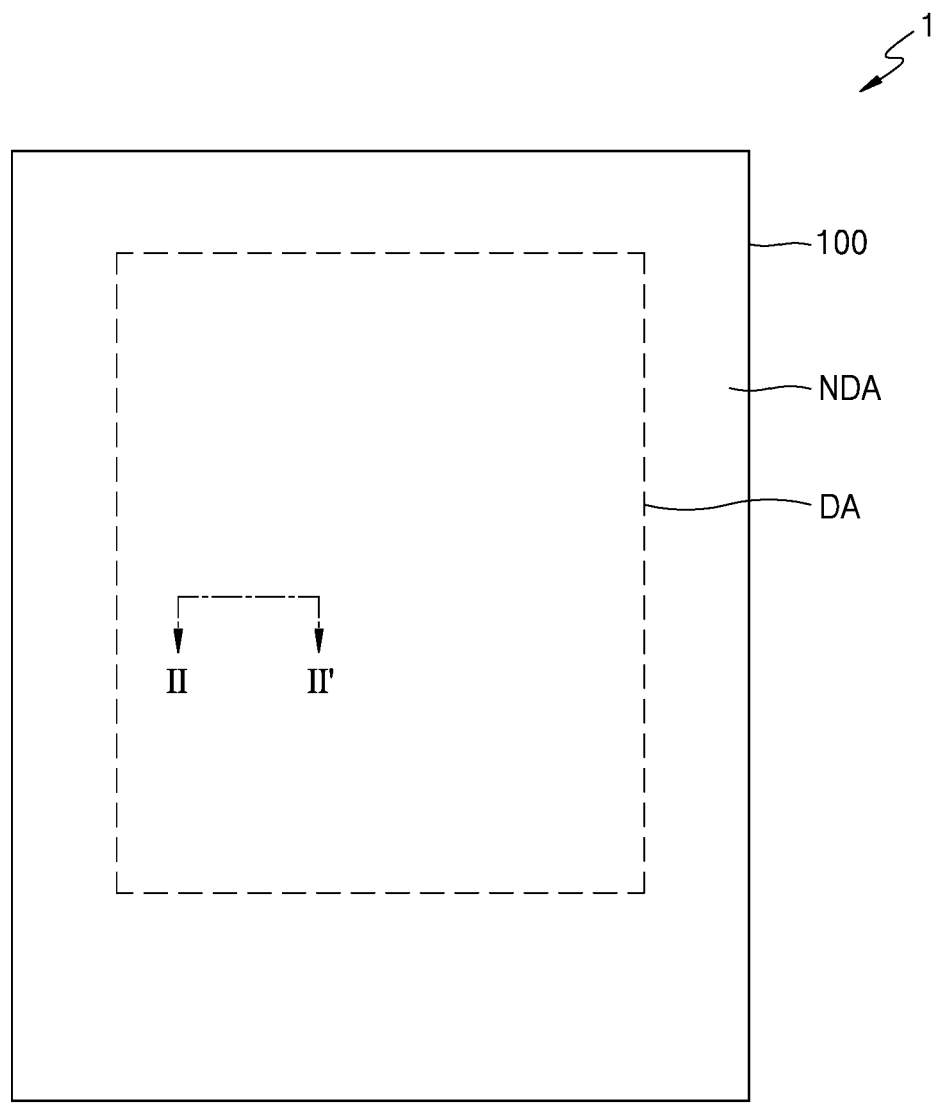
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to embodiments disclosed herein, but may be implemented in a variety of forms.

Hereinafter, embodiments of the present disclosure will be described in detail with reference to the accompanying drawings, and the same or corresponding components are denoted by the same reference numerals, and the same reference numerals are assigned and redundant explanations will be omitted.

In the disclosure, the terms of the first and second, etc. are used for the purpose of distinguishing one element from other elements, and not in a limiting sense. Further, a singular expression includes a plurality of expressions unless the context is clearly different.

In the disclosure, terms such as "comprising," "including," or "having" encompass a set of features or the elements described in the specification, not in a limiting sense, and one or more other features or elements may be removed from or added to the set.

In the disclosure, when an element such as a layer, a region, an element, or the like is described as being "on" another element, the element may be directly on the another element, or other elements may be interposed therebetween.

In the drawings, for convenience of explanation, the sizes of elements may be exaggerated or reduced. For example, since the size and thickness of each component shown in the drawings may be arbitrarily indicated for convenience of explanation, and the present disclosure is not necessarily limited by the illustration.

In the present specification, in the case where some embodiments may be implemented in the present specification, a specific process order may be performed differently from the order described. For example, two processes described in succession may be substantially performed at the same time, or in an opposite order to an order to be described.

In the present specification, "A and/or B" is A, B, or A and B. In addition, "at least one of A and B" is A, B, or A and B.

In the following embodiments, when a layer, a region, a component, etc. are connected to each other, the layers, the regions, and the components may be directly connected to each other and/or the layers, the regions, and the components may be indirectly connected to each other with other layers, other regions and other components interposed between the layers, the regions, and the components. For example, when a layer, a region, a component, etc. are electrically connected to each other in the present specification, the layer, the region, the component, etc. may be directly electrically connected to each other, and/or the layer, the region, the component, etc. may be indirectly electrically connected to each other with other layers, other regions and other components interposed between the layers, the regions, and the components.

The DR1-axis, the DR2-axis, and the DR3-axis are not limited to three axes on a Cartesian coordinate system, and may be interpreted in a broad sense. For example, the DR1-axis, the DR2-axis, and the DR3-axis may be perpendicular to each other, but may refer to different directions that are not orthogonal to each other.

FIG. 1 is a plan view schematically illustrating a display apparatus according to an embodiment.

Referring to FIG. 1, a display apparatus 1 may include a display area DA and a non-display area NDA. Sub-pixels may be disposed in the display area DA. The sub-pixels may each include a display element, such as a light-emitting diode. The sub-pixels may display an image in the display area DA. The non-display area NDA may surround the display area DA. The non-display area NDA may be an area in which no image is displayed. A scan driver, a data driver, and power supply lines may be disposed in the non-display area NDA. The scan driver and the data driver may provide electrical signals to the sub-pixels of the display area DA. Power, such as a driving voltage and a common voltage, may be provided through the power supply lines.

FIG. 1 illustrates that the display apparatus 1 has a length in a first direction DR1 that is less than a length in a second direction DR2 crossing the first direction DR1. However, one or more embodiments are not limited thereto. In another embodiment, for example, in a case that the length in the first direction DR1 may be greater than the length in the second direction DR2, the shape of the display apparatus 1 may be variously changed.

The display apparatus 1 may be applied to various products, such as mobile phones, smart phones, table personal computers (PCs), mobile communication terminals, electronic notes, electronic books, portable multimedia players (PMPs), navigation devices, ultra mobile PCs, televisions (TVs), laptop computers, monitors, billboards, Internet of Things (IoT), or the like. In addition, the display apparatus 1 according to an embodiment may be used for a wearable device such as a smart watch, a watch phone, a glasses type display, or a head mounted display (HMD). In addition, the display apparatus 1 according to an embodiment may be used as an instrument panel of a vehicle, a center information display (CID) display disposed on a center fascia or a dashboard of a vehicle, a room mirror display for replacing a side mirror of a vehicle, or a display screen for content consumption disposed on a rear surface of a front seat of a vehicle.

Figure 2A:
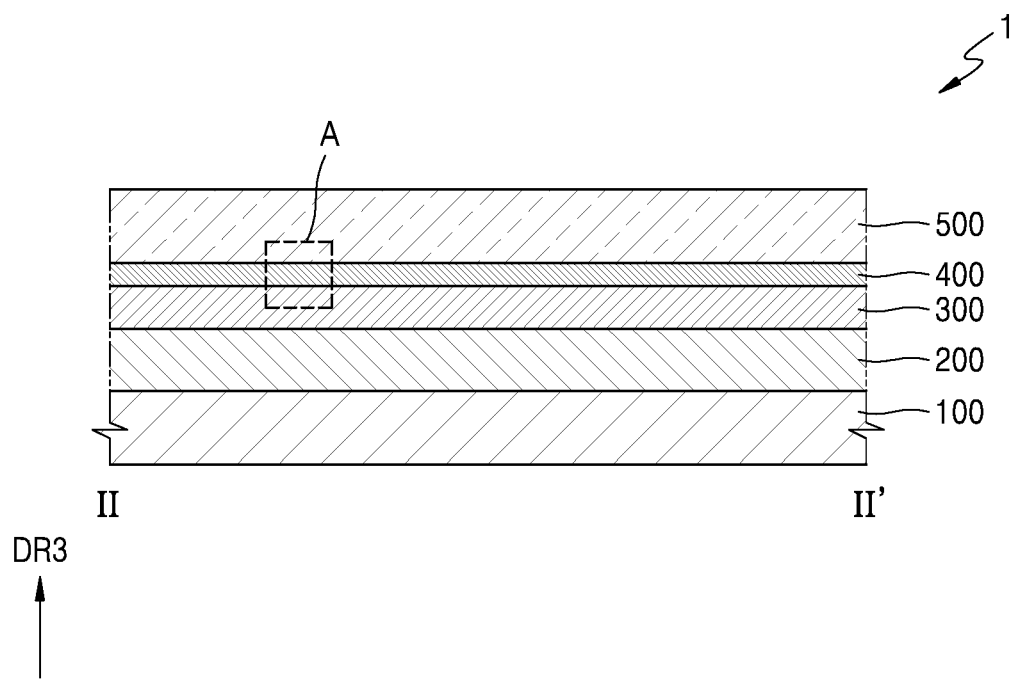
FIG. 2A is a cross-sectional view of the display apparatus taken along a line II-II' of FIG. 1.

FIG. 2A is a cross-sectional view of the display apparatus 1 taken along a line II-II' of FIG. 1.

Referring to FIG. 2A, the display apparatus 1 may include a display element layer 200 disposed on a substrate 100. The substrate 100 may include various materials such as a glass material, a metal material, or a plastic material such as polyethylene terephthalate (PET), polyethylene naphthalate (PEN), polyimide (PI), or the like. The display element layer 200 may include sub-pixels. The sub-pixels may include, for example, an organic light-emitting element, and may display an image. The display element layer 200 may be covered by an encapsulation layer 300.

The encapsulation layer 300 may face the substrate 100 with the display element layer 200 therebetween. The encapsulation layer 300 may protect the display element layer 200 from external moisture or oxygen. An input sensing layer 400 may be disposed on the encapsulation layer 300.

The input sensing layer 400 may include a plurality of touch electrodes. The plurality of touch electrodes may be conductive type touch electrodes. For example, the input sensing layer 400 may be capacitive. The input sensing layer 400 may output coordinates of a position of approach or contact of an object by using a change in capacitance that occurs when the object such as a user's finger approaches or contacts the surface of the input sensing layer 400.

An optical functional layer 500 may be disposed on the input sensing layer 400. The optical functional layer 500 may include an anti-reflective layer. The anti-reflective layer may include a polarization plate or may include a layer including a black matrix and a color filter. The optical functional layer 500 may include an overcoat layer and/or a window on the anti-reflective layer.

Figure 2B:
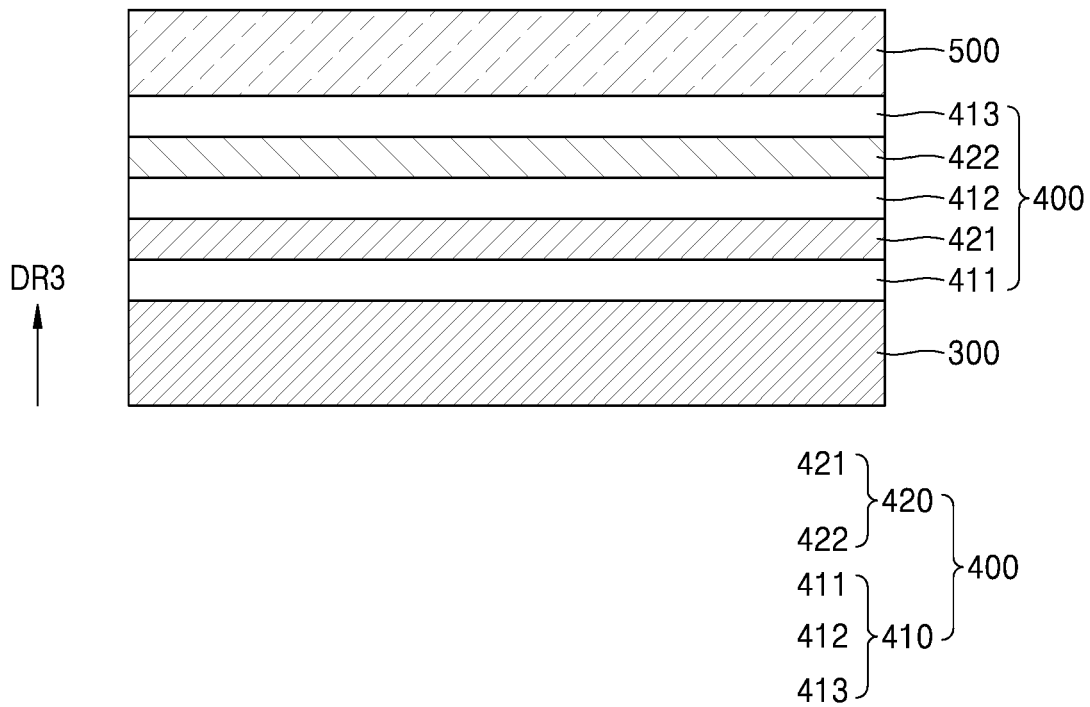
FIG. 2B is an enlarged cross-sectional view of the display apparatus of a region A of FIG. 2A.

FIG. 2B is an enlarged cross-sectional view of the display apparatus 1 of a region A of FIG. 2A.

The input sensing layer 400 may be disposed between the encapsulation layer 300 and the optical functional layer 500. The input sensing layer 400 may include a touch insulating layer 410 and a touch conductive layer 420. In an embodiment, the touch conductive layer 420 of the input sensing layer 400 may include a first touch conductive layer 421 and a second touch conductive layer 422, and the touch insulating layer 410 of the input sensing layer 400 may include a first touch insulating layer 411 and a second touch insulating layer 412, which may be disposed under and on the first touch conductive layer 421, respectively, and a third touch insulating layer 413 on the second touch conductive layer 422.

The first touch insulating layer 411 may be disposed on the encapsulation layer 300. The first touch conductive layer 421 may be in direct contact with a top surface of the first touch insulating layer 411. The second touch insulating layer 412 may be in direct contact with a top surface of the first touch conductive layer 421. The second touch conductive layer 422 may be in direct contact with an upper surface of the second touch insulating layer 412. The third touch insulating layer 413 may be in direct contact with a top surface of the second touch conductive layer 422.

Each of the first touch insulating layer 411, the second touch insulating layer 412, and the third touch insulating layer 413 may include an inorganic insulating material such as silicon oxide ($SiO_x$), silicon nitride ($SiN_x$), and/or silicon oxynitride (SiON), or an organic insulating material. For example, the first touch insulating layer 411 and the second touch insulating layer 412 may include an inorganic insulating material, and the third touch insulating layer 413 may include an organic insulating material.

Each of the first touch conductive layer 421 and the second touch conductive layer 422 may include a conductive pattern. Each of the first touch conductive layer 421 and the second touch conductive layer 422 may include a metal layer. For example, the first touch conductive layer 421 and the second touch conductive layer 422 may include titanium (Ti) and/or aluminum (Al), or the like.

FIG. 2B illustrates three touch insulating layers 410 and two touch conductive layers 420. However, embodiments are not limited thereto, and various modifications are possible. For example, according to another embodiment, the input sensing layer 400 may include two touch insulating layers 410 and one touch conductive layer 420, or four touch insulating layers 410 and three touch conductive layers 420.

Figure 3:
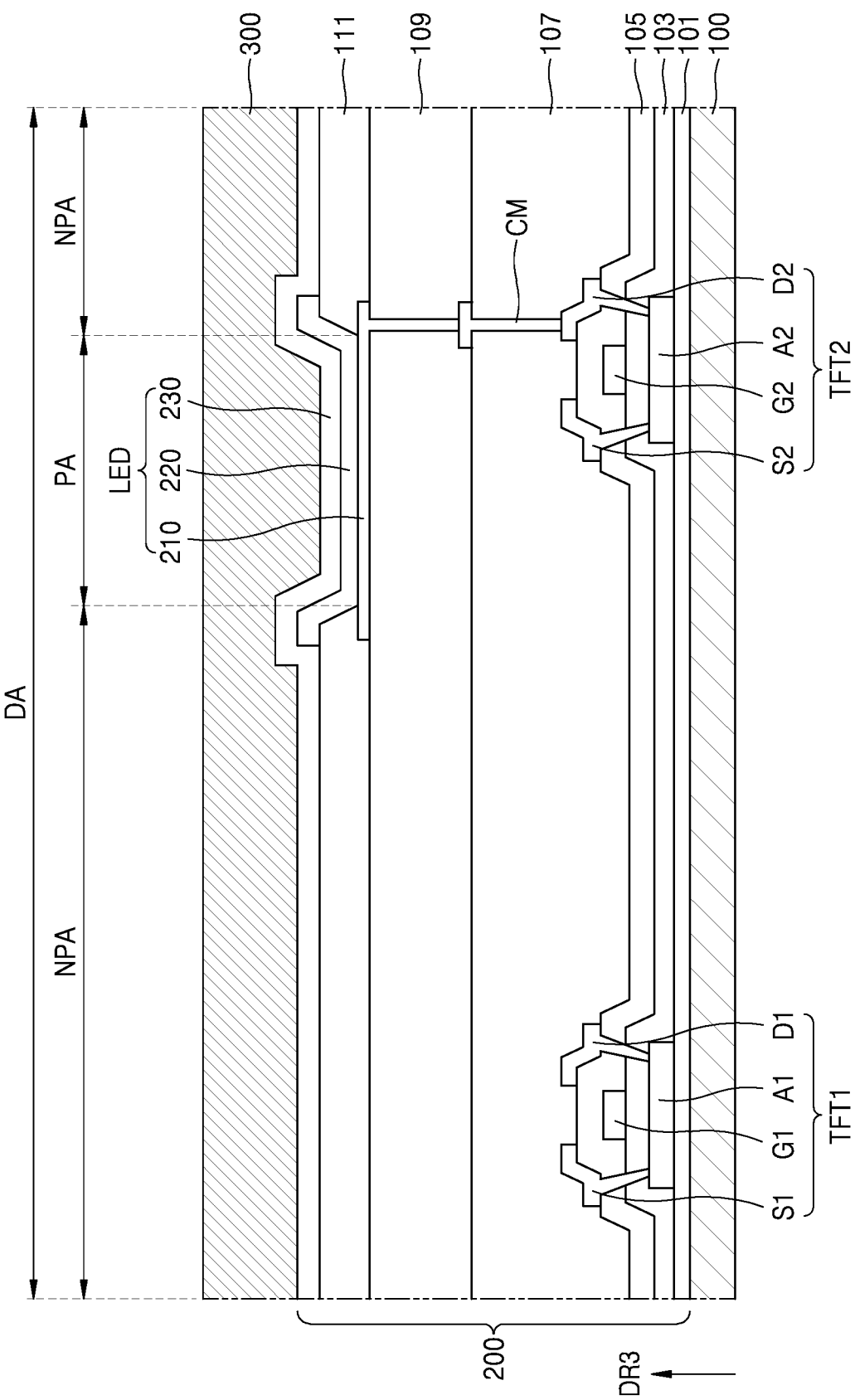
FIG. 3 is a cross-sectional view illustrating a portion of a display apparatus according to an embodiment.

FIG. 3 is a cross-sectional view illustrating a portion of a display apparatus according to an embodiment.

Referring to FIG. 3, a display element layer 200 may be disposed on a substrate 100, and the display element layer 200 may include a light-emitting diode LED corresponding to sub-pixels disposed in a display area DA. The light-emitting diode LED may be electrically connected to a second thin-film transistor TFT2.

A first thin-film transistor TFT1 may include active layer A1, a gate electrode G1 overlapping a portion of the active layer A1, a source electrode S1, and a drain electrode D1. The source electrode S1 and the drain electrode D1 may be connected to the active layer A1. The second thin-film transistors TFT2 may include active layer A2, a gate electrode G2 overlapping a portion of the active layer A2, a source electrode S2, and a drain electrode D2. The source electrode S2 and the drain electrode D2 may be connected to the active layer A2. The gate electrodes G1 and G2 may include at least one material selected from the group consisting of Al, platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), Ti, tungsten (W), or copper (Cu), and may have a single layer or multi-layered structure including the above-described materials.

A buffer layer 101 may be disposed between the active layers A1 and A2 and the substrate 100. The buffer layer 101 may resist or prevent the penetration of impurities. A gate insulating layer 103 may be disposed between the active layers A1 and A2 and the gate electrodes G1 and G2. An interlayer insulating layer 105 may be disposed on the gate electrodes G1 and G2. Each of the buffer layer 101, the gate insulating layer 103, and the interlayer insulating layer 105 may include an inorganic insulating material such as silicon oxide, silicon nitride, silicon oxynitride, aluminum oxide, aluminum nitride, titanium oxide, or titanium nitride.

The source electrodes S1 and S2 and the drain electrodes D1 and D2 may be located on the interlayer insulating layer 105 and may be connected to the active layers A1 and A2 through contact holes formed in the interlayer insulating layer 105 and the gate insulating layer 103. The source electrodes S1 and S2 and the drain electrodes D1 and D2 may include one or more of Al, Pt, Pd, Ag, Mg, Au, Ni, Nd, Ir, Cr, Li, Ca, Mo, Ti, W, or Cu, and may have a single layer or multi-layered structure.

The first organic insulating layer 107 may be disposed on the first thin-film transistor TFT1 and the second thin-film transistor TFT2. The first organic insulating layer 107 may include an organic insulating material such as acryl, benzocyclobutene (BCB), PI or hexamethyldisiloxane (HMDSO).

A contact metal CM may be disposed on the first organic insulating layer 107. The contact metal CM may include Al, Cu and/or Ti, and may have a single layer or multi-layered structure including the above-described materials.

A second organic insulating layer 109 may be disposed between the contact metal CM and a sub-pixel electrode 210. The second organic insulating layer 109 may include an organic insulating material such as acryl, BCB, PI or HMDSO. According to an embodiment described with reference to FIG. 3, the second thin-film transistor TFT2 and the sub-pixel electrode 210 may be electrically connected to each other via the contact metal CM. However, according to another embodiment, the contact metal CM may be omitted, and an organic insulating layer may be located between the second thin-film transistor TFT2 and the sub-pixel electrode 210. Alternatively, three or more organic insulating layers may be located between the second thin-film transistor TFT2 and the sub-pixel electrode 210, and the second thin-film transistor TFT2 and the sub-pixel electrode 210 may be electrically connected to each other via a plurality of contact metals.

The sub-pixel electrode 210 may be located on the second organic insulating layer 109. The sub-pixel electrode 210 may also be formed to be a (semi-)transparent electrode or a reflective electrode. When the sub-pixel electrode 210 is formed as a (semi-)transparent electrode, the sub-pixel electrode 210 may include indium tin oxide (ITO), indium zinc oxide (IZO), zinc oxide (ZnO), indium oxide ($In_2O_3$), indium gallium oxide (IGO) or aluminum zinc oxide (AIZO). When the sub-pixel electrode 210 is formed as a reflective electrode, the sub-pixel electrode 210 may be formed by forming a reflective layer by using Ag, Mg. Al, Pt, Pd, Au, Ni, Nd, Ir, or Cr, or a compound thereof and forming a layer made of ITO, IZO, ZnO or $In_2O_3$ on the reflective layer. In an embodiment, the sub-pixel electrode 210 may have a structure in which an ITO layer, an Ag layer and an ITO layer are sequentially stacked. Embodiments are not limited thereto, and the sub-pixel electrode 210 may be formed of various materials, and various modifications are possible. For example, the structure of the sub-pixel electrode 210 may have a single layer or multi-layered structure. The sub-pixel electrode 210 may be electrically connected to the contact metal CM via contact holes formed in the second organic insulating layer 109.

A pixel-defining layer 111 may cover an edge region (or edges) of the sub-pixel electrode 210. The pixel-defining layer 111 may include an opening exposing a portion of the sub-pixel electrode 210. The opening of the pixel-defining layer 111 may correspond to a region in which light of the light-emitting diode LED may be emitted, and may define a sub-pixel area PA.

An intermediate layer 220 may be disposed on the sub-pixel electrode 210. The intermediate layer 220 may include an emission layer EML. The emission layer EML may include a low molecular weight material or polymer material. The intermediate layer 220 may have a structure in which a hole injection layer (HIL), a hole transport layer (HTL), an emission layer (EML), an electron transport layer (ETL) and/or electron injection layer (EIL) are stacked on each other in a single or composite structure.

An opposite electrode 230 may be disposed on the intermediate layer 220. The opposite electrode 230 may be formed as a (semi-)transparent electrode. The opposite electrode 230 formed as a (semi-)transparent electrode may be formed of one or more of Ag, Al, Mg, Li, Ca, Cu, lithium fluoride (LiF)/Ca, LiF/Al, MgAg, or CaAg. The opposite electrode 230 may have a thin-film shape with a thickness of about several to several tens of nanometers (nm). The opposite electrode 230 is not limited to these materials or configurations, and various modifications are possible.

The encapsulation layer 300 may be disposed on the opposite electrode 230. The encapsulation layer 300 may include an inorganic encapsulation layer including an inorganic material, and an organic encapsulation layer including an organic material. The inorganic encapsulation layer may include an inorganic insulating material, such as silicon oxide, silicon nitride, or silicon oxynitride. The organic encapsulation layer may include an organic material such as PET, PEN, polycarbonate (PC), or PI.

Figure 4:
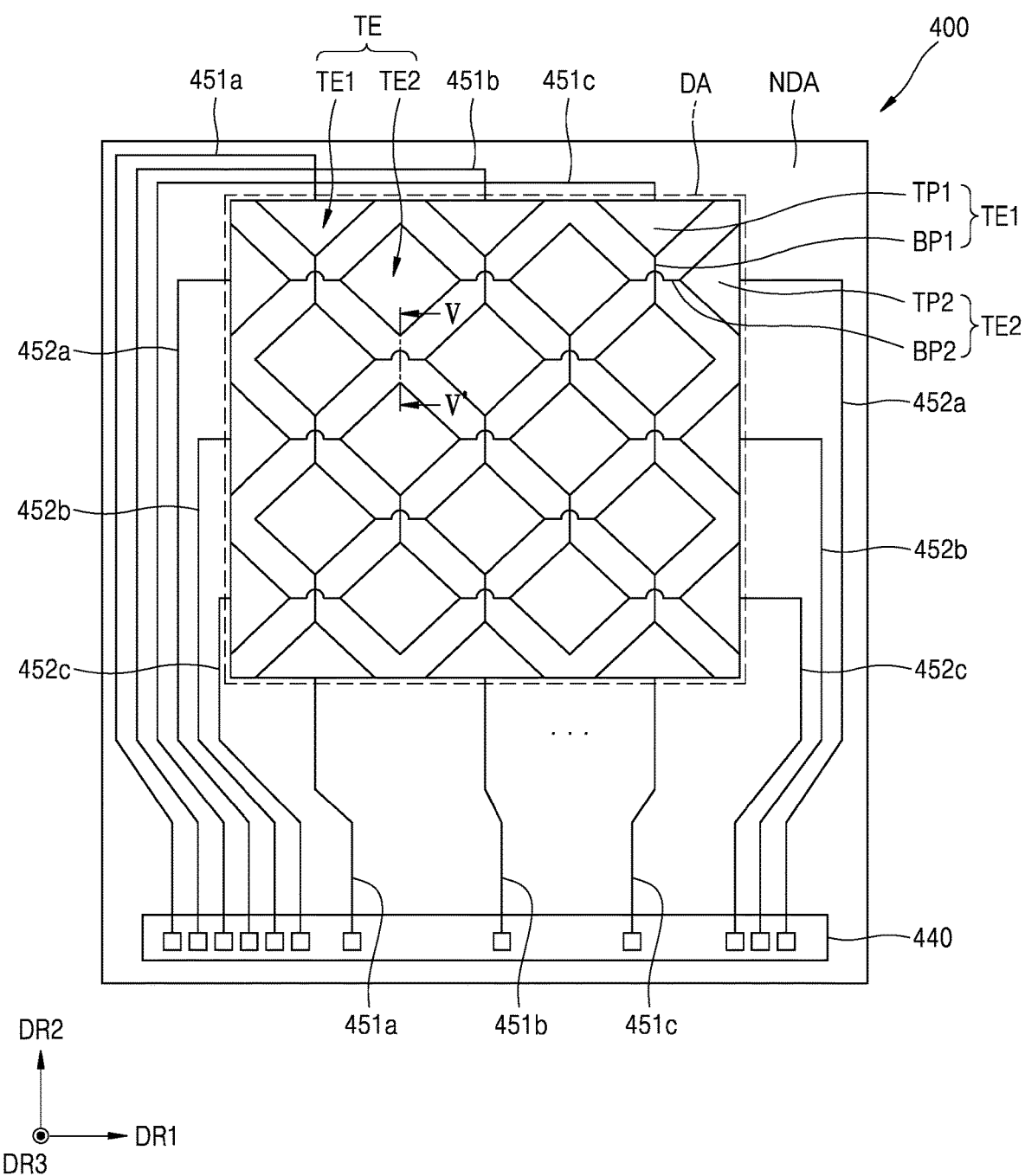
FIG. 4 is an extracted plan view illustrating an input sensing layer of a display apparatus according to an embodiment.

FIG. 4 is an extracted plan view illustrating an input sensing layer of a display apparatus according to an embodiment.

Referring to FIG. 4, an input sensing layer 400 may include first touch electrodes TE1 including first touch patterns TP1 and first bridge patterns BP1, and first signal lines 451a, 451b, and 451c connected to the first touch patterns TP1. The input sensing layer 400 may include second touch electrodes TE2 including second touch patterns TP2 and second bridge patterns BP2, and second signal lines 452a, 452b, and 452c connected to the second touch patterns TP2.

The first touch patterns TP1 may be arranged in the second direction DR2, and the second touch patterns TP2 may be arranged in the first direction DR1. The first touch patterns TP1 arranged in the second direction DR2 may be connected to each other through first bridge patterns BP1 between the adjacent first touch patterns TP1. The first touch patterns TP1 and the first bridge patterns BP1 arranged in the second direction DR2 may for a first touch electrode TE1. The second touch patterns TP2 arranged in the first direction DR1 may be connected to each other through second bridge patterns BP2 between the adjacent second touch patterns TP2. The second touch patterns TP2 and the second bridge patterns BP2 arranged in the first direction DR1 may for a second touch electrode TE2. The first touch electrodes TE1 and the second touch electrodes TE2 may cross one another. For example, the first touch electrodes TE1 and the second touch electrodes TE2 may cross one another vertically.

The first touch electrodes TE1 and the second touch electrodes TE2 may be disposed in the display area DA. The first signal lines 451a, 451b, and 451c and the second signal lines 452a, 452b, and 452c, which may be connected to the first touch patterns TP1 and the second touch patterns TP2, respectively, may be disposed in the non-display area NDA. The first touch electrodes TE1 may be connected to a sensing terminal portion 440 through the first signal lines 451a, 451b, and 451c. The second touch electrodes TE2 may be connected to the sensing terminal portion 440 through the second signal lines 452a, 452b, and 452c.

FIG. 4 illustrates that each of the first signal lines 451a, 451b and 451c is connected to upper and lower sides of each of the first touch electrodes TE1. However, embodiments are not limited thereto. In another embodiment, each of the first signal lines 451a, 451b, and 451c may be connected only the upper side or the lower side of each of the first touch electrodes TE1. In another embodiment, the first signal lines 451a, 451b, and 451c may be alternately connected to the upper side and the lower side of each of the first touch electrodes TE1, for example, where the first signal line 451a and the first signal line 451c may be connected to upper sides of respective ones of the first touch electrodes TE1 and the first signal line 451b may be connected to a lower side of a respective first touch electrode TE1.

FIG. 4 illustrates that each of the second signal lines 452a, 452b and 452c are connected to left and right sides of each of the second touch electrodes TE2. However, embodiments are not limited thereto. In another embodiment, each of the second signal lines 452a, 452b, and 452c may be connected only the left side or the right side of each of the second touch electrodes TE2. In another embodiment, the second signal lines 452a, 452b and 452c may be alternately connected to the left side and the right side of each of the second touch electrodes TE2, for example, where the second signal line 452a and the second signal line 452c may be connected to left sides of respective ones of the second touch electrodes TE2 and the second signal line 452b may be connected to a right side of a respective second touch electrode TE2.

FIG. 4 illustrates that the upper sides and the lower sides of the first signal lines 451a, 451b, and 451c may be connected to the sensing terminal portion 440. However, embodiments are not limited thereto. In another embodiment, the upper sides and the lower sides of the first signal lines 451a, 451b, and 451c may be connected to the sensing terminal portion 440 while being electrically connected to each other in the non-display area NDA.

FIG. 4 illustrates that the left sides and the right sides of the second signal lines 452a, 452b, and 452c may be connected to the sensing terminal portion 440. However, embodiments are not limited thereto. In another embodiment, the left sides and the right sides of the second signal lines 452a, 452b, and 452c may be connected to the sensing terminal portion 440 while being electrically connected to each other in the non-display area NDA.

FIG. 4 illustrates that the input sensing layer 400 may include a plurality of touch patterns in a mutual cap configuration including a first touch electrode TE1 and a second touch electrode TE2. In the mutual cap configuration, the first touch electrode TE1 may include first touch patterns TP1 arranged in a column and the second touch electrode TE2 may include second touch patterns TP2 arranged in a row. However, embodiments are not limited thereto. In another embodiment, touch patterns of the input sensing layer 400 may arranged in a self cap configuration. In the self cap configuration, the touch patterns of the input sensing layer 400 may be respectively connected to corresponding signal lines, and coordinates according to a touch event may be sensed. Hereinafter, for convenience of explanation, the case where the input sensing layer 400 is formed having the mutual cap configuration, will be described.

Figure 5:
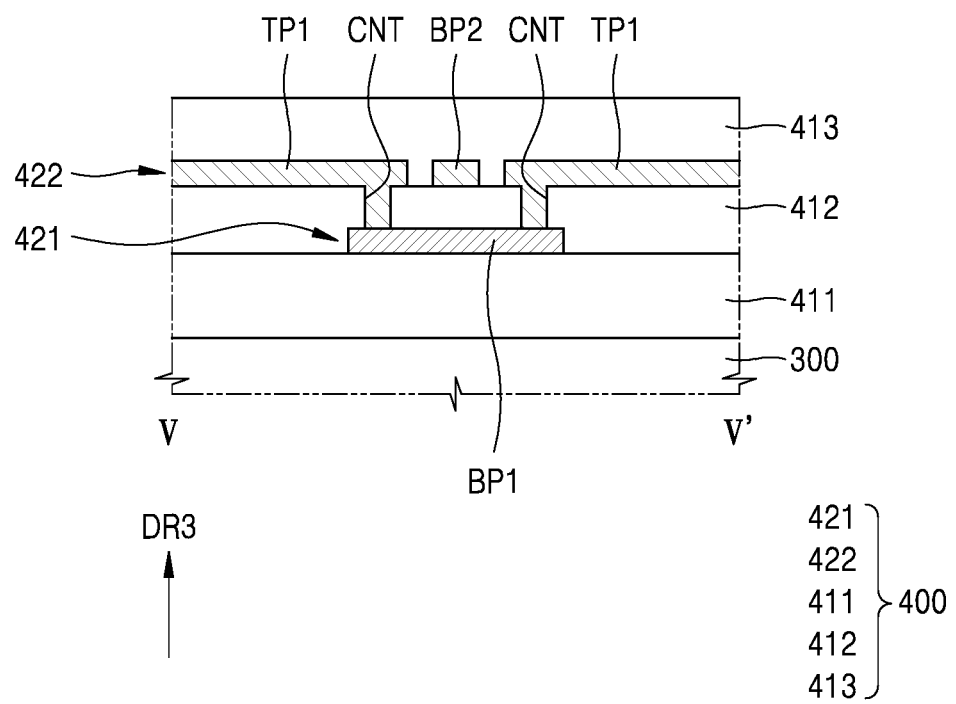
FIG. 5 is a cross-sectional view of the display apparatus taken along a line V-V' of FIG. 4.

FIG. 5 is a cross-sectional view of the display apparatus taken along a line V-V' of FIG. 4.

As described above with reference to FIG. 2B, the input sensing layer 400 may include a first touch insulating layer 411, a first touch conductive layer 421 disposed on the first touch insulating layer 411, a second touch insulating layer 412 disposed on the first touch conductive layer 421, a second touch conductive layer 422 disposed on the second touch insulating layer 412, and a third touch insulating layer 413 disposed on the second touch conductive layer 422.

The first touch conductive layer 421 may form the first bridge pattern BP1, and the second touch conductive layer 422 may form the first touch pattern TP1, the second touch pattern (not shown), and the second bridge pattern BP2. A portion of the first touch pattern TP1, a second touch pattern (not shown), and the second bridge pattern BP2 may be located on the first touch conductive layer 421. The first touch pattern TP1, the second touch pattern (not shown), and the second bridge pattern BP2 may be formed of the second touch conductive layer 422.

Adjacent ones of the second touch patterns TP2 may be electrically connected to each other via second bridge patterns BP2 located on a same layer. For example, the second touch patterns TP2 and the second bridge patterns BP2 may be disposed on a same layer. Adjacent ones of the first touch patterns TP1 may be electrically connected to each other via first bridge patterns BP1 located on different layers. For example, the first touch patterns TP1 and the first bridge patterns BP1 may be disposed on different layers. The first touch pattern TP1 may contact the first bridge pattern BP1 through contact holes CNTs formed in the second touch insulating layer 412.

FIG. 5 illustrates that the first bridge pattern BP1 may be formed of the first touch conductive layer 421 and the first touch pattern TP1, the second touch pattern (not shown), and the second bridge pattern BP2 may be formed of the second touch conductive layer 422. However, embodiments are not limited thereto. In another embodiment, the first touch pattern TP1 and the first bridge pattern BP1 may be formed of the first touch conductive layer 421 and the second touch pattern (not shown) and the second bridge pattern BP2 may be formed of the second touch conductive layer 422 without the need to form contact holes CNTs in the second touch insulating layer 412.

Figure 6:
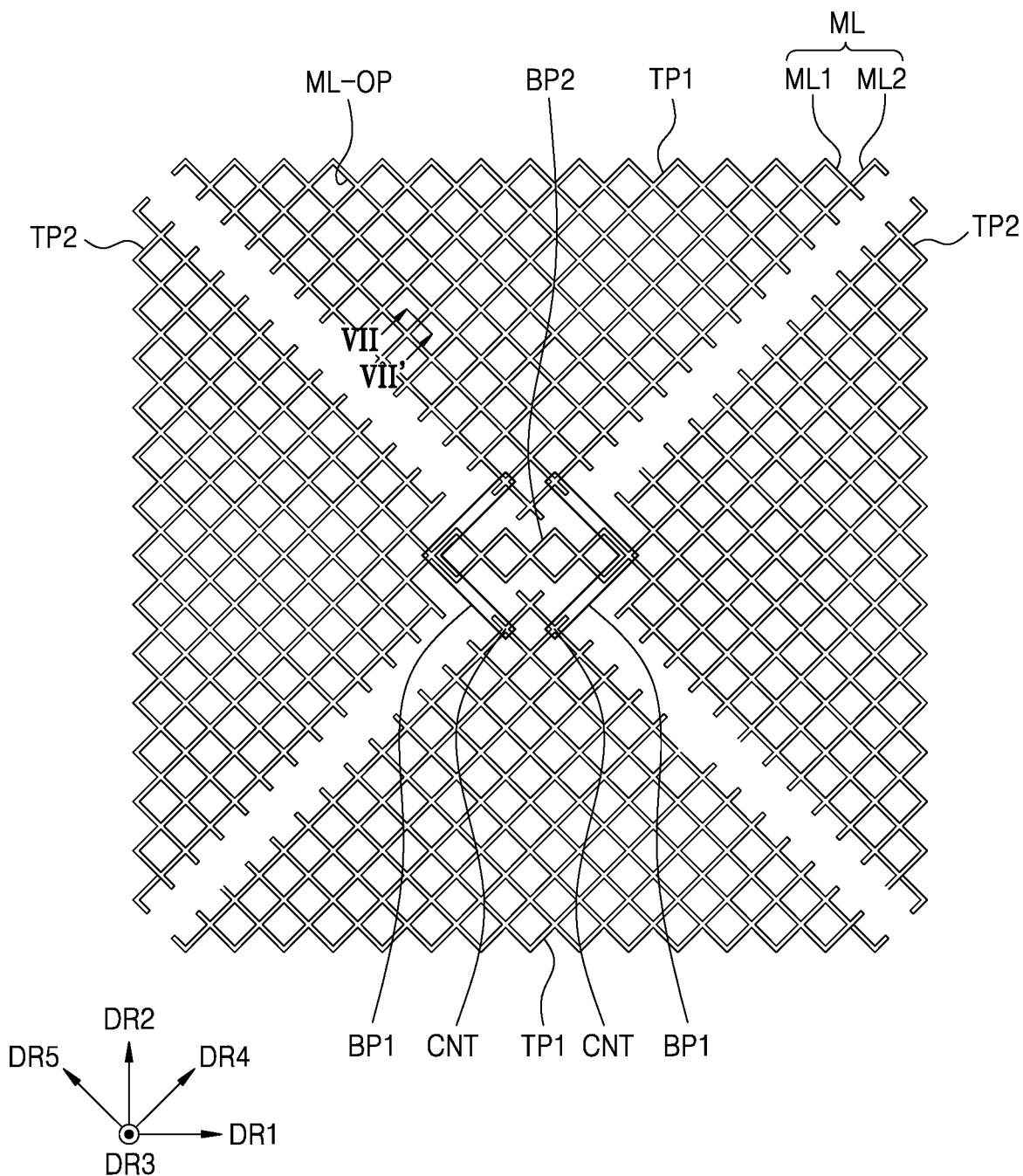
FIG. 6 is an enlarged plan view of a portion of the display apparatus of FIG. 4.

FIG. 6 is an enlarged plan view of a portion of the display apparatus of FIG. 4.

The first touch pattern TP1 and an adjacent first touch pattern TP1 may be electrically connected to each other via the first bridge pattern BP1. The second touch pattern TP2 and an adjacent second touch pattern TP2 may be electrically connected to each other via the second bridge pattern BP2. A method of connecting the first touch pattern TP1 to the first bridge pattern BP1 and a method of connecting the second touch pattern TP2 to the second bridge pattern BP2 are described with reference to FIG. 5.

Each of the first touch pattern TP1, the second touch pattern TP2, the first bridge pattern BP1, and the second bridge pattern BP2 may be a mesh pattern including first mesh lines ML1 and second mesh lines ML2. The first mesh lines ML1 may extend in a fifth direction DR5, and the second mesh lines ML2 may extend in a fourth direction DR4.

Two adjacent first mesh lines ML1 and two adjacent second mesh lines ML2 may form a mesh opening ML-OP. In other words, the mesh opening ML-OP may be defined by the first mesh lines ML1 and the second mesh lines ML2 that cross each other. A light-emitting diode (see LED of FIG. 3) may be disposed in the mesh opening ML-OP.

Figure 9A:
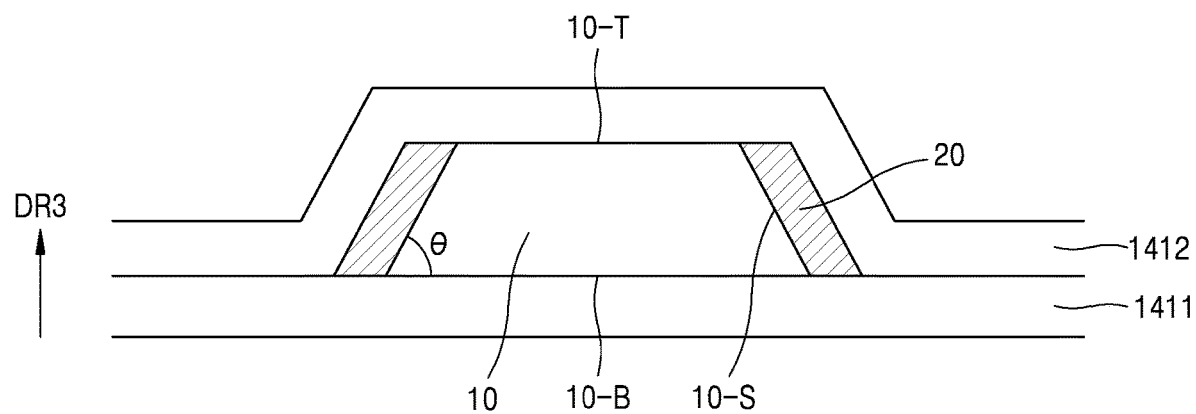
FIG. 9A, FIG. 9B, and FIG. 9C are cross-sectional views of a conductive pattern of a display apparatus according to other embodiments.
Figure 9B:
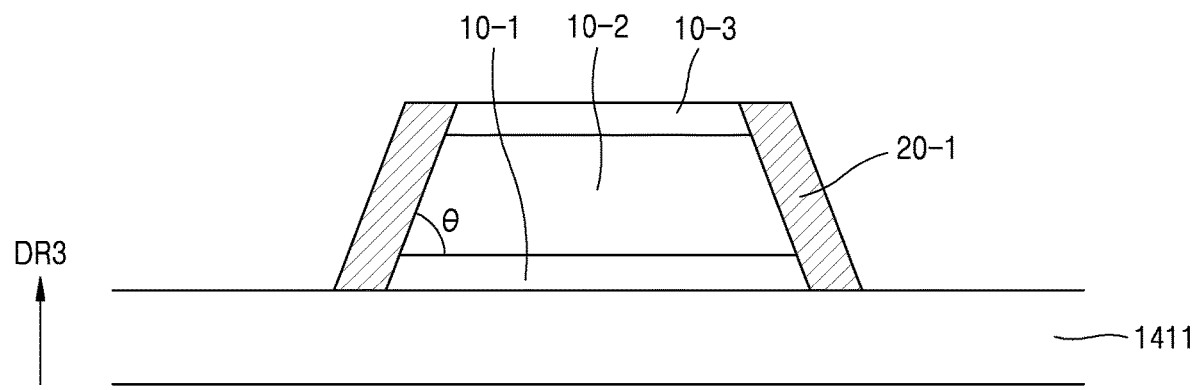
Figure 9C:
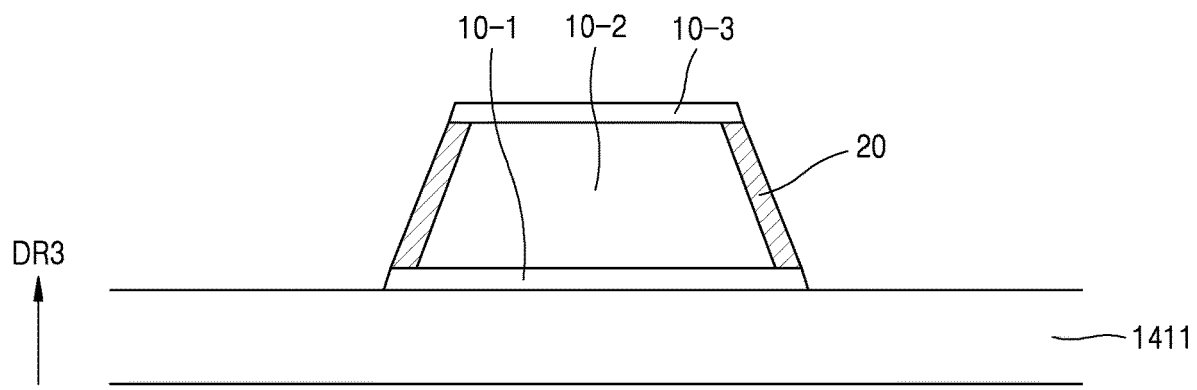

Each of the first mesh lines ML1 and each of the second mesh lines ML2 may have a structure described with reference to FIG. 7A, FIG. 7B, FIG. 7C, FIG. 9A, FIG. 9B, and FIG. 9C. In addition, a cross-sectional structure of each of the first bridge pattern BP1 and each of the second bridge pattern BP2 may have a structure described with reference to FIG. 7A, FIG. 7B, FIG. 7C. FIG. 9A, FIG. 9B, and FIG. 9C may correspond to.

Figure 7A:
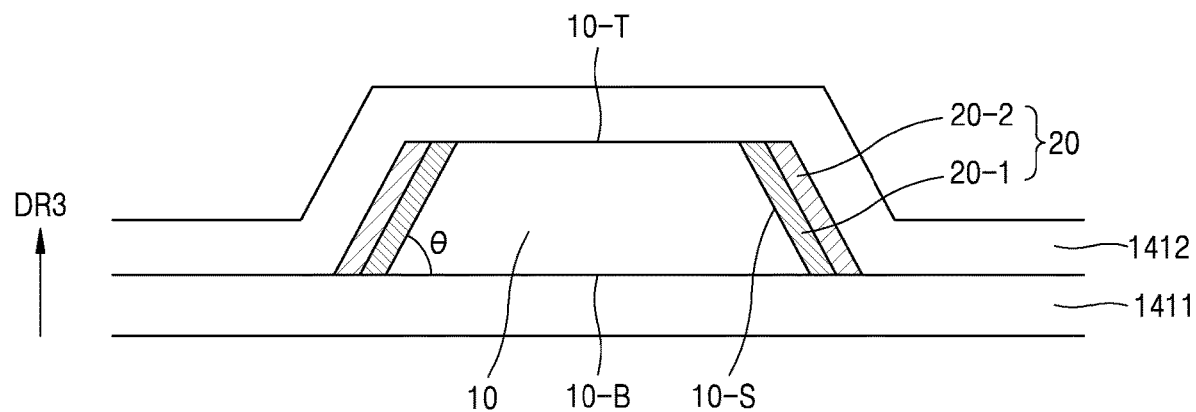
FIG. 7A, FIG. 7B, and FIG. 7C are cross-sectional views of a conductive pattern of a display apparatus according to embodiments.

FIG. 7A is a cross-sectional view of a conductive pattern 10 of a display apparatus according to embodiments.

The conductive pattern 10 may be disposed on a first insulating layer 1411. The conductive pattern 10 may include a bottom surface 10-B that is in direct contact with the first insulating layer 1411, a top surface 10-T opposite to the bottom surface 10-B, and side surfaces 10-S between the bottom surface 10-B and the top surface 10-T. The first insulating layer 1411 may be the first touch insulating layer 411 or the second touch insulating layer 412 described with reference to FIG. 5.

Each of the side surfaces 10-S of the conductive pattern 10 may include an inclined surface with respect to a top surface of the first insulating layer 1411. For example, the inclined surface may extend from the top surface 10-T downward to the bottom surface 10-B, where the bottom surface 10-B may be wider than the top surface 10-T. An angle θ formed between the inclined surface of each of the side surfaces 10-S and the top surface of the first insulating layer 1411 (or the bottom surface 10-B of the conductive pattern 10) may be about 60 to about 90 degrees.

The conductive pattern 10 may include a metal layer. For example, the conductive pattern 10 may have a single layer or multi-layered structure including Ti and/or Al.

A cladding pattern 20 may be disposed on each of the side surfaces 10-S of the conductive pattern 10. For example, the cladding pattern 20 may be in direct contact with each of the side surfaces 10-S of the conductive pattern 10 and may cover each of the side surfaces 10-S of the conductive pattern 10. The cladding pattern 20 may include a first cladding layer 20-1 that is in direct contact with each of the side surfaces 10-S of the conductive pattern 10, and a second cladding layer 20-2 that is disposed on the first cladding layer 20-1. The first cladding layer 20-1 and the second cladding layer 20-2 may include different materials.

The first cladding layer 20-1 may include a metal layer. For example, the first cladding layer 20-1 may include Ti, Cr, Mo, or the like. In some embodiments, the first cladding layer 20-1 may include the same material as a material of the conductive pattern 10.

The second cladding layer 20-2 may include a silicon (Si) element and may include an insulating material. For example, the second cladding layer 20-2 may include silicon oxide ($SiO_x$), silicon nitride ($SiN_x$), silicon carbide (SiC), silicon oxynitride (SiON), amorphous silicon (a-Si), or the like.

A second insulating layer 1412 may be disposed on the first insulating layer 1411, the conductive pattern 10, and the cladding pattern 20. For example, the second insulating layer 1412 may cover the conductive pattern 10 and the cladding pattern 20. The second insulating layer 1412 may be the second touch insulating layer 412 or the third touch insulating layer 413 described with reference to FIG. 5.

Figure 7B:
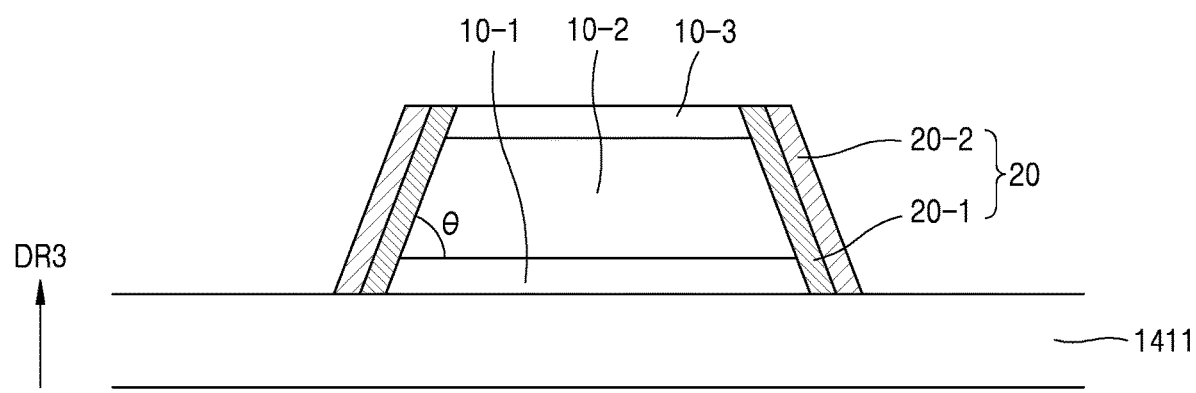

FIG. 7B is a cross-sectional view of a conductive pattern 10 of a display apparatus according to embodiments.

Referring to FIG. 7B, the conductive pattern 10 may include first conductive pattern layer 10-1, second conductive pattern layer 10-2, and third conductive pattern layer 10-3, and a cladding pattern 20 may be disposed on a side surface of the conductive pattern 10. The cladding pattern 20 may be substantially the same as that described with reference to FIG. 7A.

The conductive pattern 10 may include a first conductive pattern layer 10-1, a second conductive pattern layer 10-2, and a third conductive pattern layer 10-3. The first conductive pattern layer 10-1 may be disposed on the first insulating layer 1411 and may be in direct contact with the first insulating layer 1411. The second conductive pattern layer 10-2 may be formed on the first conductive pattern layer 10-1 and may have a thickness greater than a thickness of the first conductive pattern layer 10-1. The third conductive pattern layer 10-3 may be formed on the second conductive pattern layer 10-2 and may have a thickness less than the thickness of the second conductive pattern layer 10-2. For example, the thickness of the second conductive pattern layer 10-2 may be greater than the thicknesses of the first conductive pattern layer 10-1 and the third conductive pattern layer 10-3, and the thickness of the first conductive pattern layer 10-1 and the thickness of the third conductive pattern layer 10-3 may be the same. For example, the second conductive pattern layer 10-2 may have a thickness of about several thousand angstrom. For example, the second conductive pattern layer 10-2 may have a thickness of about 1000 angstrom to about 9000 angstrom.

Each of side surfaces of the second conductive pattern layer 10-2 may include an inclined surface with respect to a top surface of the first insulating layer 1411. An angle θ between the inclined surface of the second conductive pattern layer 10-2 and the top surface of the first insulating layer 1411 may be about 60 degrees to about 90 degrees.

Figure 7C:
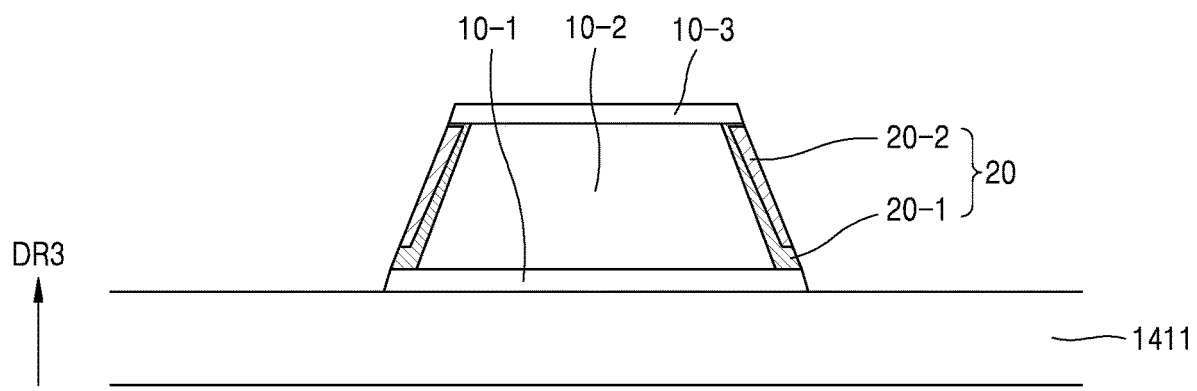

FIG. 7C is a cross-sectional view of a conductive pattern 10 of a display apparatus according to an embodiment.

First pattern layer 10-1, second pattern layers 10-2, and third conductive pattern layer 10-3 may include metal. The second conductive pattern layer 10-2 may include a material having a different etching selectivity from an etching selectivity of each of the first conductive pattern layer 10-1 and the third conductive pattern layer 10-3. For example, the second conductive pattern layer 10-2 may include Al, and the first conductive pattern layer 10-1 and the third conductive pattern layer 10-3 may include Ti.

When the conductive pattern 10 is etched, the second conductive pattern layer 10-2 may be selectively etched as compared to the first conductive pattern layer 10-1 and the third conductive pattern layer 10-3, so that the conductive pattern 10 may have an undercut shape. For example, widths of the first conductive pattern layer 10-1 and the third conductive pattern layer 10-3 may be greater than a width of the second conductive pattern layer 10-2.

A cladding pattern 20 may be disposed on side surfaces of the second conductive pattern layer 10-2. The cladding pattern 20 may include a first cladding layer 20-1 and a second cladding layer 20-2.

A portion of the first cladding layer 20-1 may cover the side surfaces of the second conductive pattern layer 10-2. For example, a portion of the first cladding layer 20-1 may be in direct contact with the side surfaces of the second conductive pattern layer 10-2. A portion of the first cladding layer 20-1 may be disposed on a portion of a bottom surface of the third conductive pattern layer 10-3 that protrudes from a point where the bottom surface of the third conductive pattern layer 10-3 and the side surfaces of the second conductive pattern layer 10-2 meet. For example, a portion of the third conductive pattern layer 10-3 may protrude from a top surface of the second conductive pattern layer 10-2. A portion of the first cladding layer 20-1 may be disposed on a portion of a top surface of the first conductive pattern layer 10-1 that protrudes from a point where the top surface of the first conductive pattern layer 10-1 and the side surfaces of the second conductive pattern layer 10-2 meet. For example, portion the first conductive pattern layer 10-1 may protrude from the second conductive pattern layer 10-2. For example, the protrusion of the first conductive pattern layer 10-1 and the protrusion of the third conductive pattern layer 10-3 may form a cavity on the side surfaces of the second conductive pattern layer 10-2 in which the cladding pattern 20 may be disposed.

A thickness of the first cladding layer 20-1 may not be uniform. For example, the thickness of the first cladding layer 20-1 may decrease in a direction. In an embodiment, the thickness of the first cladding layer 20-1 may decrease in the third direction DR3. In other words, the thickness of the first cladding layer 20-1 may increase as the first cladding layer 20-1 gets closer to the first insulating layer 1411.

The first cladding layer 20-1 may include an upper protrusion extending along a bottom surface of the third conductive pattern layer 10-3 and a lower protrusion extending along a top surface of the first conductive pattern layer 10-1. For example, a cavity may be formed in the first cladding layer 20-1 and the second cladding layer 20-2 may be disposed on the first cladding layer 20-1 in the cavity.

The first cladding layer 20-1 may have a thickness of at least about 300 angstrom (Å). For example, a thinnest-formed portion of the first cladding layer 20-1 may have a thickness of about 300 angstrom (Å) or more.

The first cladding layer 20-1 may include metal. In an embodiment, the first cladding layer 20-1 may include metal having a lower reflectivity than the metal included in the second conductive layer 10-2. For example, the second conductive pattern layer 10-2 may include Al, and the first cladding layer 20-1 may include Ti.

The second cladding layer 20-2 may be disposed on the first cladding layer 20-1. The second cladding layer 20-2 may cover a portion of the first cladding layer 20-1. FIG. 7C illustrates that the second cladding layer 20-2 covers a portion of the first cladding layer 20-1. However, embodiments are not limited thereto. In another embodiment, the second cladding layer 20-2 may cover all of the first cladding layer 20-1. For example, the second cladding layer 20-2 may cover an entire side surface of the first cladding layer 20-1 opposite the first conductive pattern layer 10-1.

A thickness of the second cladding layer 20-2 may not be uniform. For example, the thickness of the second cladding layer 20-2 may decrease in a direction. In an embodiment, the thickness of the second cladding layer 20-2 may decrease in an opposite direction to the third direction DR3. In other words, the thickness of the second cladding layer 20-2 may decrease as the second cladding layer 20-2 gets closer to the first insulating layer 1411.

FIG. 7C illustrates that the first cladding layer 20-1 and the second cladding layer 20-2 are not disposed on side surfaces of the first conductive pattern layer 10-1 and the third conductive pattern layer 10-3, respectively. However, embodiments are not limited thereto. In another embodiment, a portion of each of the first cladding layer 20-1 and/or the second cladding layer 20-2 may be disposed on a side surface of each of the first conductive pattern layer 10-1 and/or the third conductive pattern layer 10-3.

FIG. 8A, FIG. 8B, FIG. 8C, FIG. 8D are cross-sectional views schematically illustrating state in a manufacturing process of a conductive pattern 10 of a display apparatus according to an embodiment.

Figure 8A:
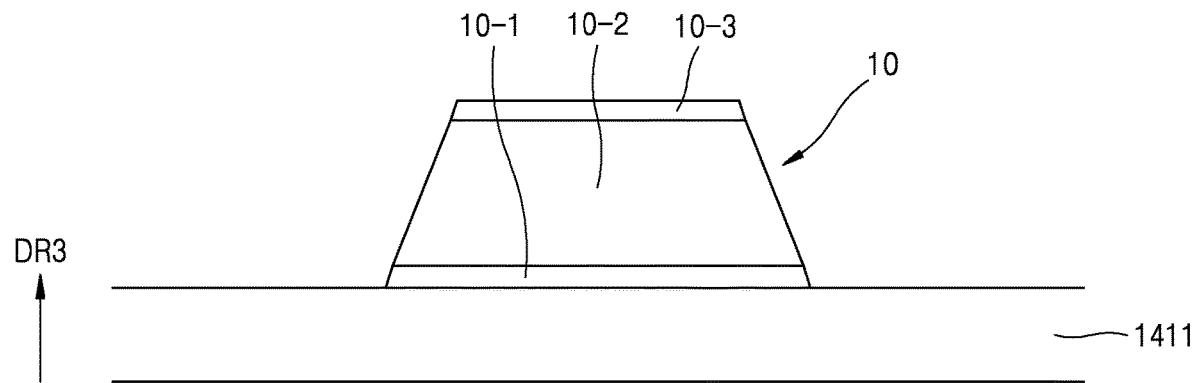
FIG. 8A, FIG. 8B, FIG. 8C, and FIG. 8D are cross-sectional views schematically illustrating a state according to a manufacturing process of a conductive pattern of a display apparatus according to an embodiment.

Referring to FIG. 8A, the conductive pattern 10 may be formed on the first insulating layer 1411. The conductive pattern 10 may include a plurality of conductive pattern layers. A first conductive pattern layer 10-1 of the conductive pattern 10 may be in direct contact with a top surface of the first insulating layer 1411. A second conductive pattern layer 10-2 of the conductive pattern 10 may be in direct contact with the first conductive pattern layer 10-1. A third conductive pattern layer 10-3 of the conductive pattern 10 may be in direct contact with a top surface of the second conductive pattern layer 10-2. For example, the first conductive pattern layer 10-1, the second conductive pattern layer 10-2, and the third conductive pattern layer 10-3 may be sequentially stacked on the first insulating layer 1411. Each of side surfaces of the second conductive pattern layer 10-2 may include an inclined surface with respect to the top surface of the first insulating layer 1411. For example, a width of the top surface of the first conductive pattern layer 10-1 and a width of a bottom surface of the second conductive pattern layer 10-2 may be the same. Further, a width of a top surface of the second conductive pattern layer 10-2 and a width of a bottom surface of the third conductive pattern layer 10-3 may be the same.

The second conductive pattern layer 10-2 may include a material having a different etching selectivity from an etching selectivity of each of the first conductive pattern layer 10-1 and the third conductive pattern layer 10-3. For example, the second conductive pattern layer 10-2 may include Al, and the first conductive pattern layer 10-1 and the third conductive pattern layer 10-3 may include Ti.

Figure 8B:
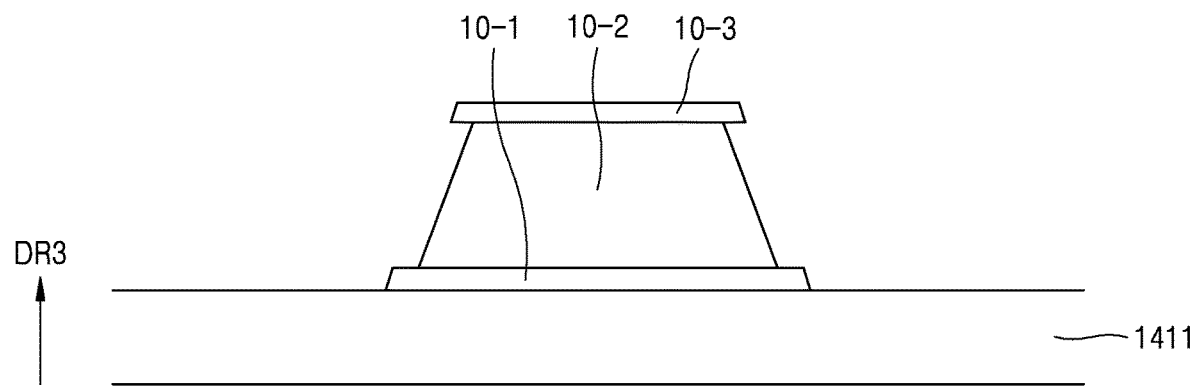

Referring to FIG. 8B, a portion of the conductive pattern 10 may be over-etched. For example, the conductive pattern 10 may have an undercut shape. For example, etching of the second conductive pattern layer 10-2 may be selectively etched and the conductive pattern 10 may have an undercut shape. In other words, a width of the bottom surface of the second conductive pattern layer 10-2 may be smaller than a width of the top surface of the first conductive pattern layer 10-1, and a width of the top surface of the second conductive pattern layer 10-2 may be smaller than a width of a bottom surface of the third conductive pattern layer 10-3. For example, the width of the first conductive pattern layer 10-1 and the width of the third conductive pattern layer 10-3 may be greater than a width of adjacent portions of the second conductive pattern layer 10-2 to form a cavity on the side surfaces of the second conductive pattern layer 10-2.

Figure 8C:
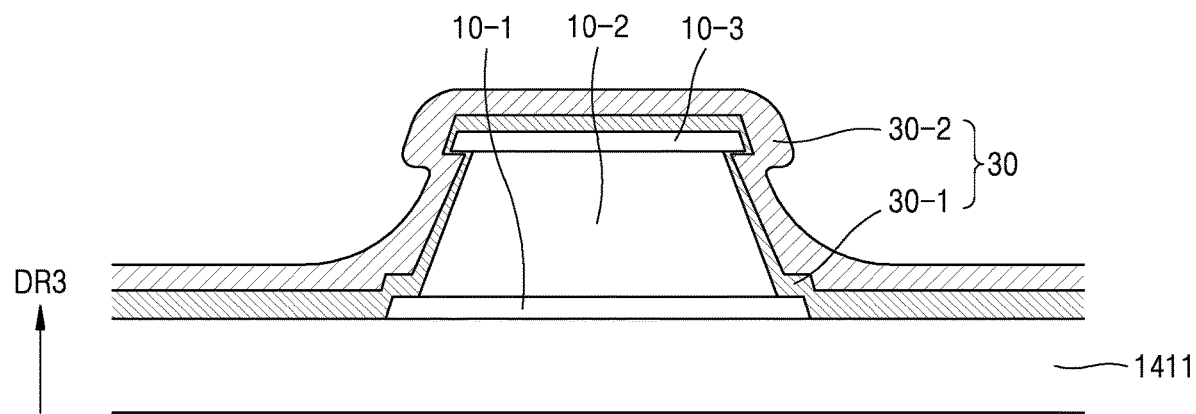

Referring to FIG. 8C, a cladding material layer 30 may be formed on the first insulating layer 1411. The cladding material layer 30 may be formed on the conductive pattern 10. The cladding material layer 30 may include a first cladding material layer 30-1 and a second cladding material layer 30-2. In an embodiment, the first cladding material layer 30-1 may cover the first insulating layer 1411 and the first through third conductive pattern layers 10-1 to 10-3. A thickness of a portion of the first cladding material layer 30-1 formed on the top surface of the first insulating layer 1411 and the top surface of the third conductive pattern layer 10-3 may be greater than a thickness of a portion of the first cladding material layer 30-1 formed on the side surfaces of the second conductive pattern layer 10-2. The second cladding layer 30-2 may cover a portion of the first cladding layer 30-1.

The first cladding layer 30-1 may include metal. In an embodiment, the first cladding layer 30-1 may include metal having a lower reflectivity than a reflectivity of the metal included in the second conductive layer 10-2. For example, the second conductive pattern layer 10-2 may include Al, and the first cladding layer 30-1 may include Ti.

The second cladding layer 30-2 may include a Si element. For example, the second cladding layer 30-2 may include silicon oxide ($SiO_x$), silicon nitride ($SiN_x$), SiC, SiON, a-Si, or the like.

Figure 8D:
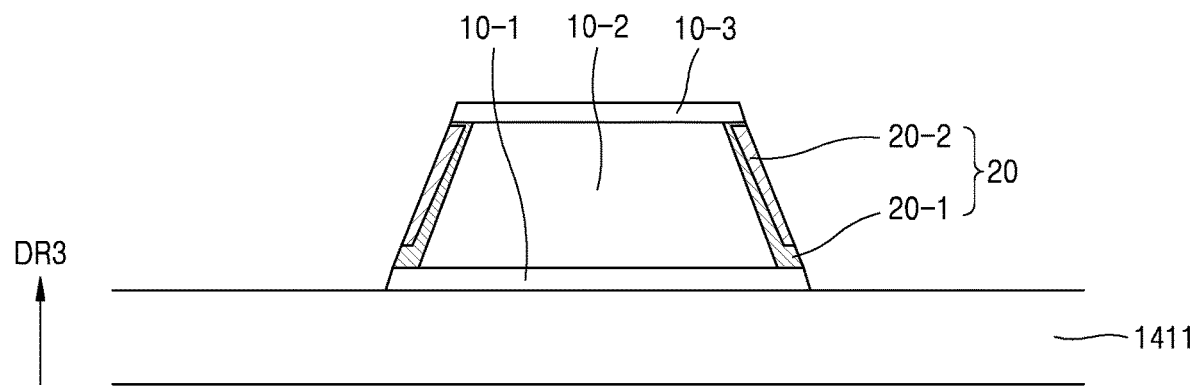

The first cladding material layer 30-1 and the second cladding material layer 30-2 may be etched. The first cladding material layer 30-1 and the second cladding material layer 30-2 may be etched without a separate mask. By the etching of the first cladding material layer 30-1 and the second cladding material layer 30-2, the cladding pattern 20 may be formed on the side surfaces of the conductive pattern 10, as shown in FIG. 8D.

A process of etching the first and second cladding material layers 30-1 and 30-2 may include anisotropic etching. For example, a process of etching the first and second cladding material layers 30-1 and 30-2 may include anisotropic dry etching.

Through the etching, a portion of the first cladding material layer 30-1 and a portion of the second cladding material layer 30-2 may be removed. Through the etching, a portion of the first and second cladding material layers 30-1 and 30-2 formed on the top surface of the first insulating layer 1411 and a portion of the first and second cladding material layers 30-1 and 30-2 formed on the top surface of the third conductive pattern layer 10-3 may be removed.

FIG. 8C illustrates that the cladding material layer 30 may have a multi-layered structure including the first cladding material layer 30-1 and the second cladding material layer 30-2. However, embodiments are not limited thereto. In another embodiment, the cladding material layer 30 may have a single layer, and may include materials included in the first cladding material layer 30-1 and/or the second cladding material layer 30-2. For example, the cladding material layer 30 may have a single layer structure including SiC or a-Si. The cladding material layer 30 may be formed by, for example, a chemical vapor deposition (CVD).

Referring to FIG. 8D, the cladding pattern 20 may include a first cladding layer 20-1 and a second cladding layer 20-2.

The cladding pattern 20 may be left following an etching of the cladding material layer (see 30 of FIG. 8C), shown in FIG. 8C. For example, the first cladding layer 20-1 may be formed by etching the first cladding material layer (see 30-1 of FIG. 8C). The second cladding layer 20-2 may be formed by etching the second cladding material layer (see 30-2 of FIG. 8C).

FIG. 8D illustrates that the cladding pattern 20 may have a multi-layered structure including the first cladding material layer 20-1 and the second cladding material layer 20-2. However, embodiments are not limited thereto. In another embodiment, the cladding pattern 20 may have a multi-layered layer, and may include materials included in the first cladding layer 20-1 and/or the second cladding layer 20-2. For example, the cladding pattern 20 may have a single layer structure including SiC or a-Si. FIG. 9C shows an embodiment in which the cladding pattern 20 may have a single layer and may include SiC or a-Si.

FIG. 7A, FIG. 7B, and FIG. 7C illustrate that the cladding pattern 20 may have a multi-layered structure including the first cladding layer 20-1 and the second cladding layer 20-2. However, embodiments are not limited thereto. In another embodiment, referring to FIG. 9A, FIG. 9B, and FIG. 9C, the cladding pattern 20 may have a single layer and may include materials included in the first cladding layer 20-1 and the second cladding layer 20-2.

Referring to FIG. 9A, the cladding pattern 20 may have a single layer structure, and may include a Si element. For example, the cladding pattern 20 may have a single layer structure including SiC or a-Si. Other features of FIG. 9A may be described with reference to FIG. 7A, and further description thereof may be omitted.

Referring to FIG. 9B, cladding pattern 20 may have a single layer structure, and may include a Si element. For example, the cladding pattern 20 may have a single layer structure including SiC or a-Si. Other features of FIG. 9B may be described with reference to FIG. 7B, and further description thereof may be omitted.

Referring to FIG. 9C, the cladding pattern 20 may have a single layer structure, and may include a Si element. For example, the cladding pattern 20 may have a single layer structure including SiC or a-Si. Other features of FIG. 9C may be described with reference to FIG. 7C, and further description thereof may be omitted.

Figure 10A:
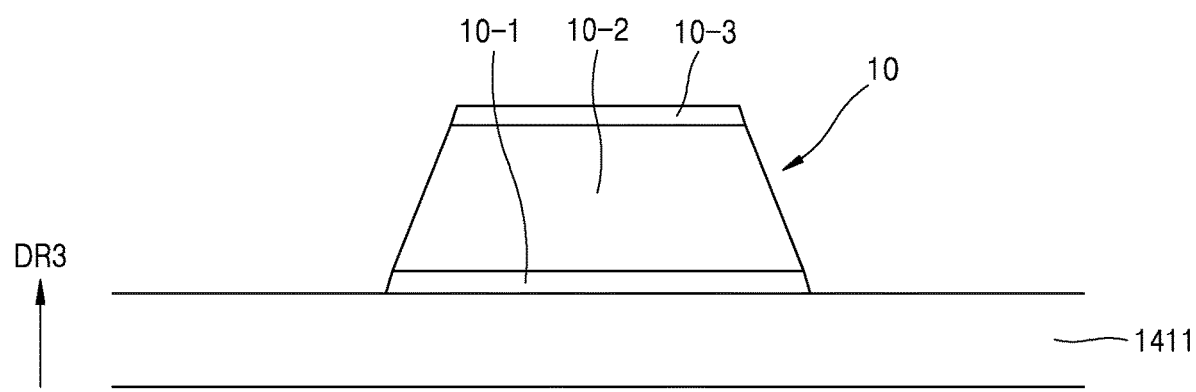
FIG. 10A, FIG. 10B, FIG. 10C, and FIG. 10D are cross-sectional views schematically illustrating a state according to a manufacturing process of a conductive pattern of a display apparatus according to another embodiment.
Figure 10B:
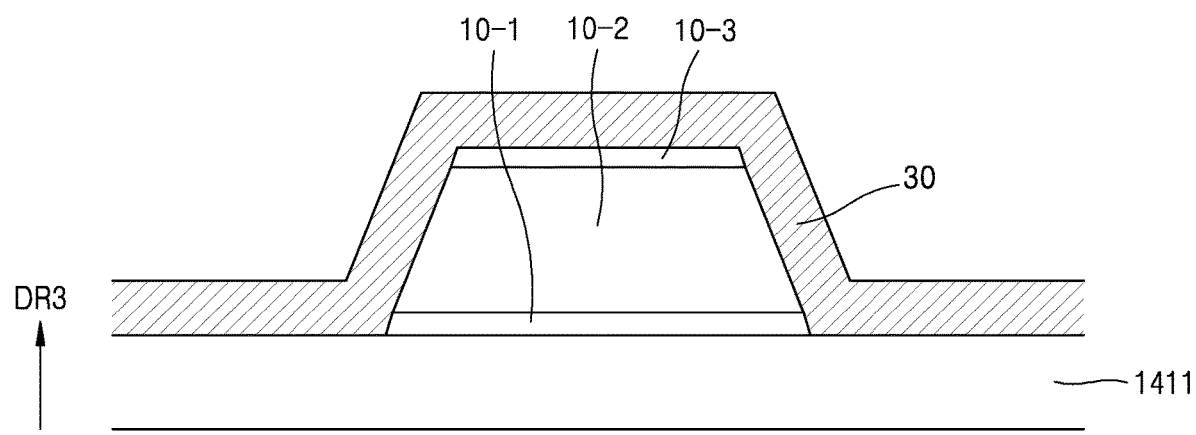
Figure 10C:
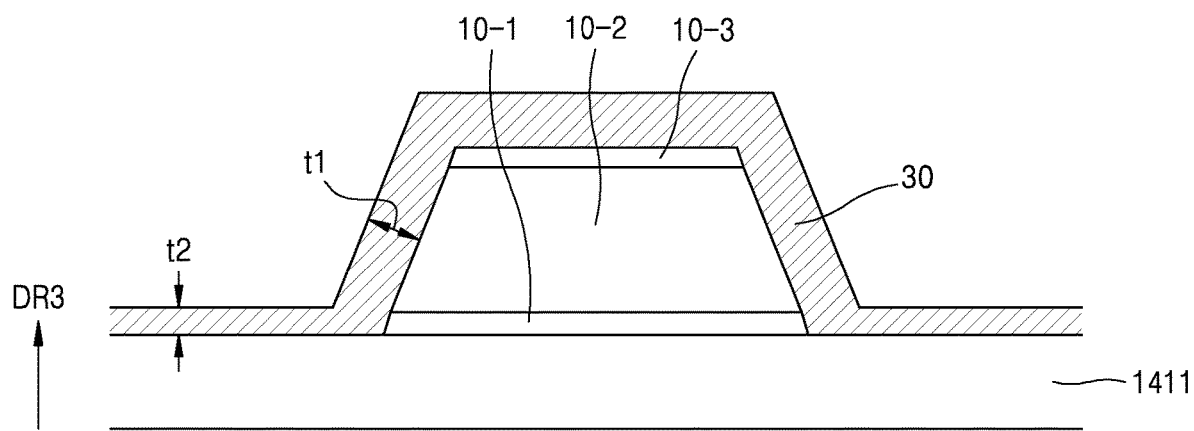
Figure 10D:
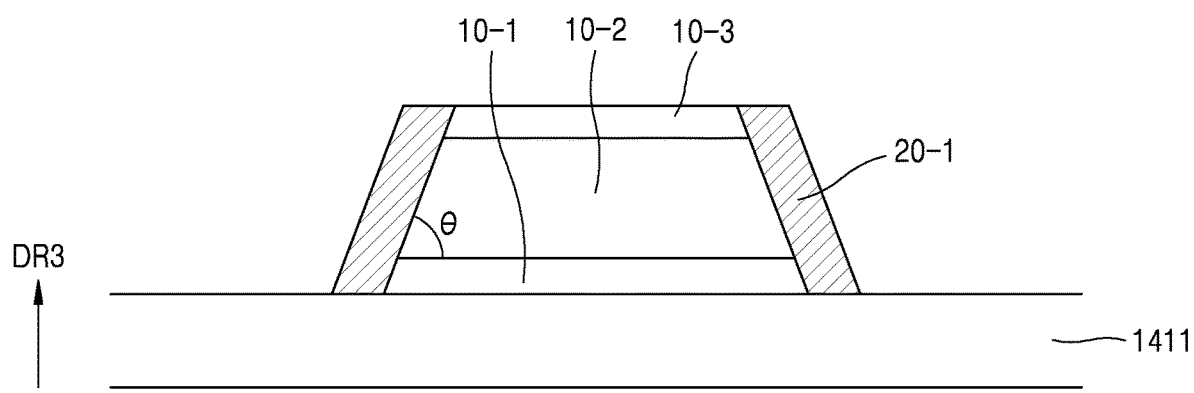

FIG. 10A, FIG., 10B, FIG. 10C, and FIG. 10D are cross-sectional views schematically illustrating a state according to a manufacturing process of a conductive pattern 10 of a display apparatus according to an embodiment.

Referring to FIG. 10A, the conductive pattern 10 may be formed on a first insulating layer 1411, for example, as described with reference to FIG. 8A. The conductive pattern 10 may include first conductive pattern layer 10-1, second conductive pattern layer 10-2, and third conductive pattern layer 10-3.

The second conductive pattern layer 10-2 may include a material having a different etching selectivity from an etching selectivity of each of the first conductive pattern layer 10-1 and the third conductive pattern layer 10-3. For example, the second conductive pattern layer 10-2 may include Al, and the first conductive pattern layer 10-1 and the third conductive pattern layer 10-3 may include Ti.

Referring to FIG. 10B, a cladding material layer 30 may be formed on the first insulating layer 1411. In an embodiment, the cladding material layer 30 may cover the first insulating layer 1411 and the first through third conductive pattern layers 10-1 to 10-3.

The cladding material layer 30 may be formed to a substantially uniform thickness. The cladding material layer 30 may be formed by, for example, CVD. For example, the cladding material layer 30 may be formed to a substantially uniform thickness of about 1500 angstrom (A) by using CVD. Embodiments are not limited to these numbers.

The cladding material layer 30 may include a Si element. For example, the cladding material layer 30 may include $SiO_x$ or a-Si.

Referring to FIG. 10C, the cladding material layer 30 may be etched. The cladding material layer 30 may be etched without a separate mask.

A process of etching the cladding material layers 30 may include anisotropic etching. For example, the process of etching the cladding material layer 30 may include anisotropic dry etching.

For example, when the etching is performed, an etching speed of a layer in which a target material is disposed perpendicular to an etching direction, may be faster than an etching speed of a layer in which the target material is disposed diagonal to the etching direction.

When the etching is performed in an opposite direction to the third direction DR3, the etching speed of a region in which the cladding material layer 30 is disposed perpendicular to the third direction DR3, may be faster than the etching speed of a region in which the cladding material layer 30 is disposed diagonal to the third direction DR3. For example, the etching speed of a portion of the cladding material layer 30 disposed on a top surface of the conductive pattern 10 and the top surface of the first insulating layer 1411, may be faster than the etching speed of a portion of the cladding material layer 30 disposed on side surfaces of the conductive pattern 10.

The thickness of the cladding material layer 30 during etching may be different according to a region in which the cladding material layer 30 is disposed. For example, a thickness t1 of a portion of the cladding material layer 30 disposed on each of the side surfaces of the conductive pattern 10 may be greater than a thickness t2 of a portion of the cladding material layer 30 disposed on the top surface of the conductive pattern 10 and the top surface of the first insulating layer 1411.

Referring to FIG. 10D, a cladding pattern 20 may be disposed on each of the side surfaces of the conductive pattern 10.

The etching speed of the cladding material layer (see 30 of FIG. 10C) may be different according to a region in which the cladding material layer 30 is disposed. Thus, all of a portion of the cladding material layer (see cladding material layer 30 of FIG. 10C) disposed on the top surface of the conductive pattern 10 and the top surface of the first insulating layer 1411 may be removed, and the cladding material layer 30 may remain only in the side surfaces of the conductive pattern 10. For example, the cladding material layer 30 may be formed on the side surfaces of the conductive pattern 10, and may not be formed on other portions of the conductive pattern 10.

The cladding pattern 20 may be a portion (e.g., a portion disposed on each of the side surfaces of the conductive pattern 10) formed by etching of the cladding material layer (see cladding material layer 30 of FIG. 10C).

Since the cladding material layer (see cladding material layer 30 of FIG. 10C) may include a Si element, the cladding pattern 20 may also include a Si element. For example, the cladding pattern 20 may include $SiO_x$ or a-Si.

FIG. 7B, FIG. 7C, FIG. 8D, FIG. 9B, FIG. 9C, and FIG. 10D do not illustrate a second insulating layer on the conductive pattern 10 and the cladding pattern 20. However, the second insulating layer may be further disposed on the conductive pattern 10 and the cladding pattern 20, as described above with reference to FIG. 7A.

According to one or more embodiments, as a display apparatus includes a cladding pattern covering a side surface of a conductive pattern, a wiring may be prevented from being visible to a user due to external light reflected on the side surface of the conductive pattern even when the thickness of the conductive pattern is increased. The above-described effects are illustrative, and the effects of the disclosure are not limited to the above description.

It should be understood that embodiments described herein should be considered in a descriptive sense only and not for purposes of limitation. Descriptions of features or aspects within an embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus including an input sensing layer comprising:
   a first insulating layer;
   a conductive pattern disposed directly on the first insulating layer;
   a cladding pattern disposed on side surfaces of the conductive pattern and exposing a top surface of the conductive pattern opposite the first insulating layer; and
   a second insulating layer on the conductive pattern and the cladding pattern,
   wherein the cladding pattern comprises a first cladding layer including a first material and a second cladding layer including a second material different from the first material, and
   wherein the input sensing layer is formed as a mesh pattern including openings in which light-emitting diodes are disposed.

2. The display apparatus of claim 1, wherein the first material of the first cladding layer comprises a metal.

3. The display apparatus of claim 1, wherein the second material of the second cladding layer comprises silicon and is formed on the first cladding layer.

4. The display apparatus of claim 1, wherein the conductive pattern comprises:
   a first conductive pattern layer disposed on the first insulating layer;
   a second conductive pattern layer disposed on the first conductive pattern layer and having a thickness greater than a thickness of the first conductive pattern layer; and
   a third conductive pattern layer disposed on the second conductive pattern layer and having a thickness less than the thickness of the second conductive pattern layer.

5. The display apparatus of claim 4, wherein the second conductive pattern layer comprises a material having an etch selectivity different from an etch selectivity of each of the first conductive pattern layer and the third conductive pattern layer.

6. The display apparatus of claim 4, wherein the side surfaces of the second conductive pattern layer are inclined surfaces with respect to a top surface of the first insulating layer, and
   the first cladding layer covers at least a portion of the inclined surfaces of the second conductive pattern layer.

7. The display apparatus of claim 6, wherein the inclined surfaces of the second conductive pattern layer are disposed at an angle of about 60 degrees with respect to the top surface of the first insulating layer.

8. The display apparatus of claim 1, wherein a thickness of at least a portion of the first cladding layer increases in a direction.

9. The display apparatus of claim 1, wherein the second cladding layer is in direct contact with the first cladding layer, and a thickness of the second cladding layer decreases in a direction.

10. The display apparatus of claim 4, wherein a width of the third conductive pattern layer is greater than a width of the second conductive pattern layer.

11. The display apparatus of claim 2, wherein the metal comprises titanium (Ti).

12. The display apparatus of claim 3, wherein the second cladding layer comprises at least one of silicon oxide ($SiO_x$), silicon nitride ($SiN_x$), silicon oxynitride (SiON), or amorphous silicon (a-Si).

13. A method of manufacturing an input sensing layer of a display apparatus, the method comprising:
forming a first insulating layer;
forming a conductive pattern directly on the first insulating layer;
forming a cladding pattern on side surfaces of the conductive pattern and exposing a top surface of the conductive pattern opposite the first insulating layer; and
forming a second insulating layer on the conductive pattern and the cladding pattern,
wherein the cladding pattern comprises a first cladding layer including a first material and a second cladding layer including a second material different from the first material.

14. The method of claim 13, wherein the forming of the conductive pattern comprises:
forming a first conductive pattern layer on the first insulating layer;
forming a second conductive pattern layer on the first conductive pattern layer and having a thickness greater than a thickness of the first conductive pattern layer; and
forming a third conductive pattern layer on the second conductive pattern layer and having a thickness less than a thickness of the second conductive pattern layer.

15. The method of claim 14, further comprising selectively etching the second conductive pattern layer, wherein the conductive pattern has an undercut shape,
wherein forming the second conductive pattern layer comprises forming the second conductive pattern layer having side surfaces having an inclined surface with respect to a top surface of the first insulating layer, and the first cladding layer covers the inclined surface of the second conductive pattern layer and exposes the first conductive pattern layer and the third conductive pattern layer.

16. The method of claim 14, wherein a width of the third conductive pattern layer is greater than a width of the second conductive pattern layer.

17. The method of claim 13, wherein the forming of the conductive pattern comprises:
forming a first cladding material layer on the conductive pattern;
forming a second cladding material layer on the first cladding material layer; and
etching the first cladding material layer and the second cladding material layer to form the first cladding layer and the second cladding layer, respectively.

18. The method of claim 17, wherein the etching of the first cladding material layer and the second cladding material layer comprises dry etching.

19. The method of claim 13, wherein the first cladding layer comprises a metal and the second cladding layer comprises silicon.

20. A display apparatus including an input sensing layer comprising:
a first insulating layer;
a conductive pattern comprising a bottom surface in direct contact with the first insulating layer, a top surface opposite to the bottom surface, and side surfaces between the bottom surface and the top surface;
a cladding pattern disposed on the side surfaces of the conductive pattern and exposing the top surface of the conductive pattern opposite the first insulating layer; and
a second insulating layer on the top surface of the conductive pattern and the cladding pattern,
wherein the cladding pattern comprises silicon.

* * * * *